United States Patent
Shan

(10) Patent No.: US 10,718,820 B2
(45) Date of Patent: Jul. 21, 2020

(54) DC/DC TEST SYSTEM AND METHOD

(71) Applicants: BOE Technology Group Co., Ltd., Beijing (CN); Chengdu BOE Optoelectronics Technology Co., Ltd., Chengdu (Sichuan Province) (CN)

(72) Inventor: Dongxiao Shan, Beijing (CN)

(73) Assignees: BOE Technology Group Co., Ltd., Beijing (CN); Chengdu BOE Optoelectronics Technology Co., Ltd., Chengdu (CN)

(*) Notice: Subject to any disclaimer, the term of this patent is extended or adjusted under 35 U.S.C. 154(b) by 316 days.

(21) Appl. No.: 15/816,130

(22) Filed: Nov. 17, 2017

(65) Prior Publication Data
US 2018/0252778 A1    Sep. 6, 2018

(30) Foreign Application Priority Data

Mar. 3, 2017  (CN) .......................... 2017 1 0122958

(51) Int. Cl.
*G01R 31/40*  (2020.01)
*G09G 3/00*  (2006.01)
*G09G 3/3225*  (2016.01)

(52) U.S. Cl.
CPC ............ *G01R 31/40* (2013.01); *G09G 3/006* (2013.01); *G09G 3/3225* (2013.01); *G09G 2330/02* (2013.01)

(58) Field of Classification Search
CPC ...... G01R 31/40; G09G 3/006; G09G 3/3225; G09G 2330/02
See application file for complete search history.

(56) References Cited

U.S. PATENT DOCUMENTS

| | | | | |
|---|---|---|---|---|
| 5,568,424 A * | 10/1996 | Cernea | .................... | G11C 16/16 365/185.18 |
| 5,777,841 A * | 7/1998 | Stone | ..................... | G01R 31/40 379/27.05 |
| 9,728,118 B2 * | 8/2017 | Park | ...................... | G09G 3/3208 |
| 2008/0301497 A1 * | 12/2008 | Chung | ................... | G06F 11/24 714/22 |
| 2011/0043505 A1 * | 2/2011 | Ahn | ........................ | H02M 3/07 345/211 |
| 2013/0265076 A1 * | 10/2013 | Pan | ........................ | G01R 31/40 324/756.07 |
| 2015/0015137 A1 * | 1/2015 | Kang | ................... | H05B 33/0896 313/504 |
| 2016/0148570 A1 * | 5/2016 | Lee | ....................... | G09G 3/3225 345/211 |
| 2019/0265311 A1 * | 8/2019 | Partee | .................... | G01R 31/40 |

* cited by examiner

*Primary Examiner* — Lee E Rodak

(74) *Attorney, Agent, or Firm* — Arent Fox LLP; Michael Fainberg

(57) ABSTRACT

The embodiments of the present disclosure disclose a DC/DC test system and a method. In the solution, based on a test system composed of a test host, a main control unit, a DC/DC unit, a programmable power supply, an input monitoring unit, an output monitoring unit and a load unit, the efficiency test of the DC/DC unit can be automatically realized, the test of linear adjustment rate and load regulation rate can be realized, and the test efficiency can be improved.

13 Claims, 3 Drawing Sheets

DC/DC TEST SYSTEM AND METHOD

CROSS-REFERENCE TO RELATED APPLICATIONS

This application claims the priority to Chinese Patent Application No. 201710122958.1, filed on Mar. 3, 2017, the content of which is hereby incorporated by reference in its entirety.

FIELD

This disclosure relates to the technical field of signal testing, and particularly to a DC/DC test system and a method.

BACKGROUND

The Direct Current to Direct Current (DC/DC) power supply can convert input direct current into required direct current. For example, in an AMOLED display, the input DC voltage needs to be converted into three DC output voltages of AVDD, ELVDD and ELVSS by utilizing DC/DC. Power efficiency test is an important test for AMOLED DC/DC. The traditional power efficiency test solution is as follows: under different input voltages and output voltages and different loading conditions, devices such as a multimeter or an oscilloscope are utilized to test the parameters of the input and output voltages and currents of the DC/DC. However, since all the parameters need to be tested at the same time, then multiple devices are required at the same time, and it is also time consuming to acquire test data from multiple devices, thereby leading to a tedious process of the power efficiency test.

SUMMARY

A DC/DC test system includes a test host, a main control unit, a DC/DC unit, a programmable power supply, an input monitoring unit, an output monitoring unit and a load unit, where the main control unit is respectively connected with the test host, the programmable power supply, the load unit, the input monitoring unit and the output monitoring unit; the programmable power supply is further connected with the input monitoring unit; the load unit is further connected with the output monitoring unit; the DC/DC unit is respectively connected with the input monitoring unit and the output monitoring unit; the main control unit is configured to, under an instruction of the test host, control the programmable power supply to output different voltage signals, control the load unit to supply the load necessary for testing the DC/DC unit, receive an input voltage and current of the DC/DC unit monitored by the input monitoring unit and an output voltage and current of the DC/DC unit monitored by the output monitoring unit, and feed monitoring results back to the test host.

A test method for the above DC/DC test system, includes: controlling, by the main control unit, under an instruction of the test host, the programmable power supply to output different preset voltage signals; controlling, by the main control unit, under each preset voltage, the load unit to serve as different loads necessary for testing the DC/DC unit; monitoring, by the input monitoring unit, the input end of the DC/DC unit, and feeding back to the main control unit; monitoring, by the output monitoring unit, the voltage and current output by the DC/DC unit, and feeding back to the main control unit; and feeding, by the main control unit, received monitoring results of the voltage and current back to the test host.

DETAILED DESCRIPTION OF THE EMBODIMENTS

A brief description will be given below on the DC/DC test system and method according to the present disclosure in combination with the accompanying drawings and embodiments.

Figure 1:
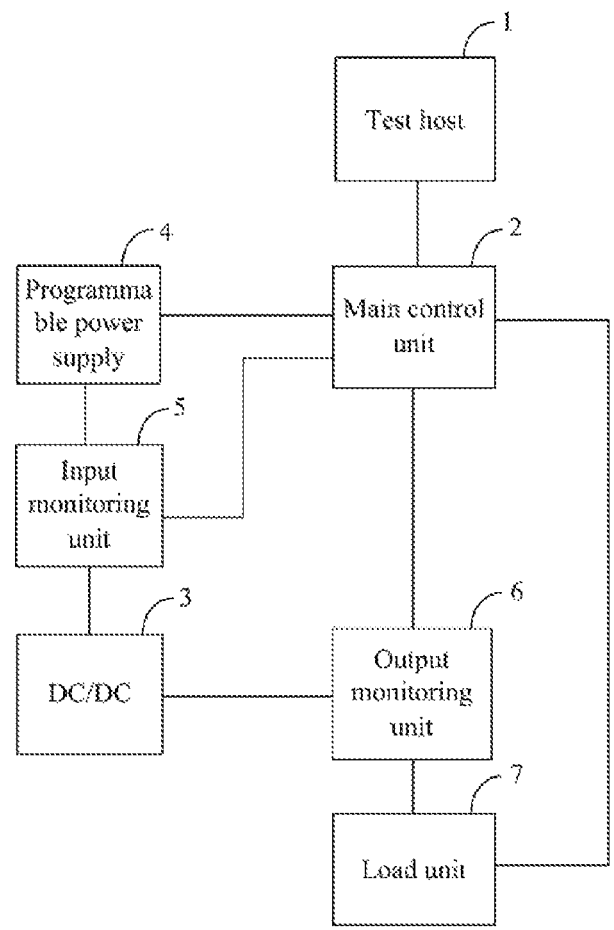
FIG. 1 is a structural schematic diagram of a DC/DC test system according to an embodiment of the present disclosure.

As shown in FIG. 1, a DC/DC test system according to the embodiment of the present disclosure includes a test host 1, a main control unit 2, a DC/DC unit 3, a programmable power supply 4, an input monitoring unit 5, an output monitoring unit 6 and a load unit 7.

The main control unit is respectively connected with the test host, the programmable power supply, the load unit, the input monitoring unit and the output monitoring unit.

The programmable power supply is further connected with the input monitoring unit.

The load unit is further connected with the output monitoring unit.

The DC/DC unit is respectively connected with the input monitoring unit and the output monitoring unit.

The main control unit is configured to, under the instruction of the test host, control the programmable power supply to output different voltages, control the load unit to supply the load necessary for testing the DC/DC unit, receive the input voltage and current of the DC/DC unit monitored by the input monitoring unit and the output voltage and current of the DC/DC unit monitored by the output monitoring unit, and feed the monitoring results back to the test host.

In the solution of the embodiment of the present disclosure, based on the test system composed of the test host, the main control unit, the DC/DC unit, the programmable power supply, the input monitoring unit, the output monitoring unit and the load unit, the efficiency test for the DC/DC unit can be automatically realized, the test of linear adjustment rate and load regulation rate can be realized, and the test efficiency is improved.

Where the test host controls the starting and ending of the whole test, the setting of parameters, and the acquisition, analysis and processing of data. After receiving the test results fed back by the main control unit, the test host can obtain the input power and the output power respectively based on the voltage and current input by the DC/DC and the voltage and current output by the ELVDD, ELVSS and AVDD, and then further calculate the ratio between the output and the input to obtain the conversion efficiency of DC/DC.

In specific implementation, the programmable power supply can be used as an input source during DC/DC test. When efficiency test is performed, the DC/DC can be tested under different input voltages, and the purpose of changing the input voltage can be achieved via the programmable power supply. When the test of linear adjustment rate is performed, the programmable power supply can also be used to generate the power supply of a leaping voltage.

Figure 2:
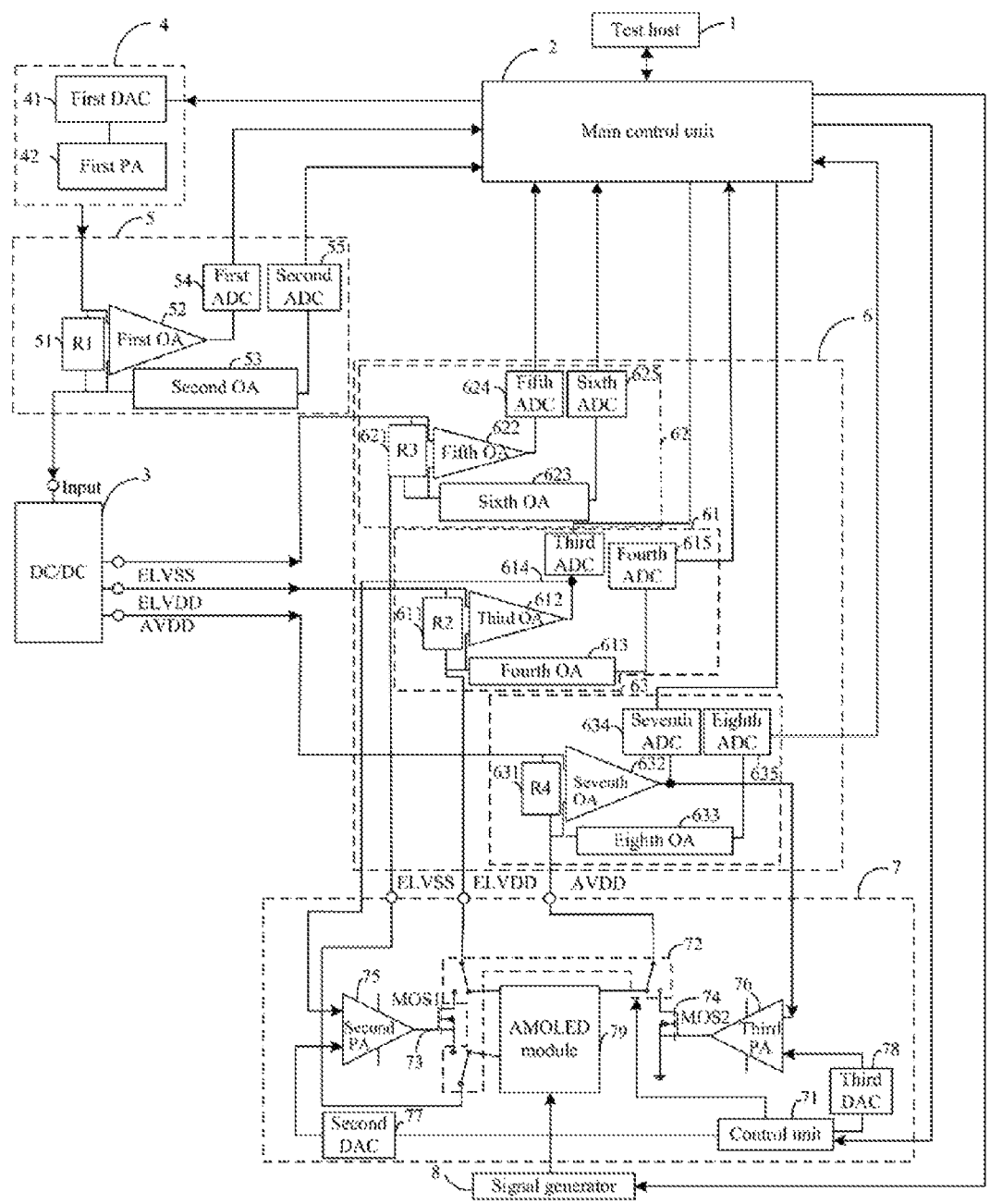
FIG. 2 is a structural schematic diagram of another DC/DC test system according to an embodiment of the present disclosure.

The programmable power supply 4 according to the embodiment of the present disclosure has multiple structures. Optionally, as shown in FIG. 2, the programmable power supply 4 includes a first Digital to Analog Converter (DAC) 41 and a first power amplifier 42.

Where the input end of the first DAC 41 is connected with the main control unit 2, while the output end of the first DAC 41 is connected with the input end of the first power amplifier 42.

The output end of the first power amplifier 42 is connected with the input end of the input monitoring unit 5.

In implementation, the main control unit 2 controls the first DAC 41 to generate the specific output voltage of the programmable power supply 4, and the voltage output by the first DAC 41 is output after being amplified by the first power amplifier 42.

The above content is merely to describe the specific structure of the programmable power supply through examples. In specific implementation, the specific structure of the programmable power supply is not limited to the above structure according to the embodiment of the present disclosure, and can be other structures known to those skilled in the art as long as the structures can provide an alterable direct current power supply, and the structure will not be defined herein.

In specific implementation, the input monitoring unit 5 has multiple structures. Optionally, as shown in FIG. 2, the input monitoring unit 5 includes a first sampling resistor (R1 in the FIG. 51, a first operational amplifier (OA for short in the FIG. 52, a second operational amplifier 53, a first Analog to Digital Converter (ADC) 54 and a second ADC 55.

The two ends of the first sampling resistor 51 are respectively connected with the output end of the programmable power supply 4 and the input end of the DC/DC unit 3. The first input end and the second input end of the first operational amplifier are respectively connected with the two ends of the first sampling resistor 51, while the output end of the first operational amplifier is connected with the input end of the first ADC 54. The output end of the first ADC 54 is connected with the main control unit 2. The input end of the second operational amplifier 53 is connected with the input end of the DC/DC unit 3, while the output end of the second operational amplifier 53 is connected with the input end of the second ADC 55. The output end of the second ADC 55 is connected with the main control unit 3.

In specific implementation, the output monitoring unit 6 has multiple structures. Optionally, as shown in FIG. 2, the output monitoring unit 6 includes a first sub-output monitoring unit 61, a second sub-output monitoring unit 62 and a third sub-output monitoring unit 63.

The first sub-output monitoring unit 61 is respectively connected with the ELVDD output end of the DC/DC unit 3, the ELVDD input end of the load unit 7 and the main control unit 2, and is configured to monitor the voltage and current of the ELVDD output end of the DC/DC unit 3.

The second sub-output monitoring unit 62 is respectively connected with the ELVSS output end of the DC/DC unit 3, the ELVSS input end of the load unit 7 and the main control unit 2, and is configured to monitor the voltage and current of the ELVSS output end of the DC/DC unit 3.

The third sub-output monitoring unit 63 is respectively connected with the AVDD output end of the DC/DC unit 3, the AVDD input end of the load unit 7 and the main control unit 2, and is configured to monitor the voltage and current of the AVDD output end of the DC/DC unit 3.

In specific implementation, the first sub-output monitoring unit 61 has multiple structures. Optionally, as shown in FIG. 2, the first sub-output monitoring unit 61 includes a second sampling resistor (R2 in the FIG. 611, a third operational amplifier 612, a fourth operational amplifier 613, a third ADC 614 and a fourth ADC 615.

The two ends of the second sampling resistor 611 are respectively connected with the ELVDD output end of the DC/DC unit 3 and the ELVDD input end of the load unit 7. The first input end and the second input end of the third operational amplifier 612 are respectively connected with the two ends of the second sampling resistor 611, while the output end of the third operational amplifier 612 is connected with the input end of the third ADC 614. The output end of the third ADC 614 is connected with the main control unit 2. The input end of the fourth operational amplifier 613 is connected with the ELVDD output end of the DC/DC unit 3, and the output end of the fourth operational amplifier 613 is connected with the input end of the fourth ADC 615. The output end of the fourth ADC 615 is connected with the main control unit 2.

In specific implementation, the second sub-output monitoring unit 62 has multiple structures. Optionally, as shown in FIG. 2, the second sub-output monitoring unit 62 includes a third sampling resistor (R3 in the FIG. 621, a fifth operational amplifier 622, a sixth operational amplifier 623, a fifth ADC 624 and a sixth ADC 625.

The two ends of the third sampling resistor 621 are respectively connected with the ELVSS output end of the DC/DC unit 3 and the ELVSS input end of the load unit 7. The first input end and the second input end of the fifth operational amplifier 622 are respectively connected with the two ends of the third sampling resistor 621, while the output end of the fifth operational amplifier 622 is connected with the input end of the fifth ADC 624. The output end of the fifth ADC 624 is connected with the main control unit 2. The input end of the sixth operational amplifier 623 is connected with the ELVSS output end of the DC/DC unit 3, while the output end of the sixth operational amplifier 623 is connected with the input end of the sixth ADC 625. The output end of the sixth ADC 625 is connected with the main control unit 2.

In specific implementation, the third sub-output monitoring unit 63 has multiple structures. Optionally, as shown in FIG. 2, the third sub-output monitoring unit 63 includes a fourth sampling resistor (R4 in the FIG. 631, a seventh operational amplifier 632, an eighth operational amplifier 633, a seventh ADC 634 and an eighth ADC 635.

The two ends of the fourth sampling resistor 631 are respectively connected with the AVDD output end of the DC/DC unit 3 and the AVDD input end of the load unit 7. The first input end and the second input end of the seventh operational amplifier 632 are respectively connected with the two ends of the fourth sampling resistor 631, while the output end of the seventh operational amplifier 632 is connected with the input end of the seventh ADC 634. The output end of the seventh ADC 634 is connected with the main control unit 2. The input end of the eighth operational amplifier 633 is connected with the AVDD output end of the DC/DC unit 3, while the output end of the eighth operational amplifier 633 is connected with the input end of the eighth ADC 635. The output end of the eighth ADC 635 is connected with the main control unit 2.

Where the first, second, third and fourth sampling resistors are the sampling resistors with extremely small resistance (the resistance is smaller than a preset value), a tiny pressure drop may be generated after the current flows through each of the sampling resistors, and after the current and voltage are amplified by the operational amplifier, the current is acquired by the DAC and fed back to the main control unit.

The above content is merely to describe the specific structures of the input and output monitoring units through examples. In specific implementation, the specific structure of the monitoring unit is not limited to the above structure according to the embodiment of the present disclosure, and can be other structures known to those skilled in the art, as long as the input and output voltage and current of the DC/DC can be monitored automatically in real time, and the structure will not be defined herein.

In specific implementation, optionally, the load unit 7 has multiple structures. As shown in FIG. 2, optionally, the load unit 7 includes a control unit 71, a diverter switch 72, a first Metal Oxide Semiconductor (MOS) transistor 73, a second MOS transistor 74, a second power amplifier (PA for short in the Figure) 75, a third power amplifier 76, a second DAC 77 and a third DAC 78.

The first end of the control unit 71 is connected with the main control unit 2, and the second end of the control unit 71 is connected with the diverter switch 72.

The gate of the first MOS transistor 73 is connected with the output end of the second power amplifier 75. The first input end and the second input end of the second power amplifier 75 are respectively connected with the output end of the third operational amplifier 612 and the output end of the second DAC 77. The input end of the second DAC 77 is connected with the control unit 71.

The gate of the second MOS transistor 74 is connected with the output end of the third power amplifier 76, and the source of the second MOS transistor 74 is grounded. The first input end and the second input end of the third power amplifier 76 are respectively connected with the output end of the seventh operational amplifier 632 and the output end of the third DAC 78. The input end of the third DAC 78 is connected with the control unit 71.

The control unit 71 is configured to, under the control of the main control unit 2, control the diverter switch 72 to conduct the drain and source of the first MOS transistor 73 respectively with the first sub-output monitoring unit 61 and the second sub-output monitoring unit 62 and conduct the drain of the second MOS transistor 74 with the third sub-output monitoring unit 63, and control the second DAC 77 and the third DAC 78 to input different current signals.

In the embodiment of the present disclosure, two MOS transistors can be used as power consumption components, the MOS transistors and the operational amplifier can constitute a feedback loop to form constant-current electronic load, and the control unit controls the second DAC and the third DAC to input specific current. Since one of the voltages of the ELVDD and the ELVSS is positive while the other is negative, and in actual implementation, the current is almost the same, then one MOS transistor is used in common as a load, while the AVDD uses another MOS transistor as a load.

Optionally, as shown in FIG. 2, the load unit further includes an Active-Matrix Organic Light Emitting Diode (AMOLED) module 79.

Correspondingly, the control unit 71 is further configured to, under the control of the main control unit 2, control the diverter switch 72 to switch between the following two states: in a first state, conduct the ELVDD, ELVSS and AVDD input ends of the AMOLED module 79 with the first sub-output monitoring unit 61, the second sub-output monitoring unit 62 and the third sub-output monitoring unit 63 respectively; in a second state, conduct the drain and source of the first MOS transistor 73 with the first sub-output monitoring unit 61 and the second sub-output monitoring unit 62 respectively, and conduct the drain of the second MOS transistor 74 with the third sub-output monitoring unit 63.

In the embodiment of the present disclosure, two loads are arranged, one is an MOS transistor, while the other is an AMOLED module, switching can be conducted between the two loads and is more flexible. When the AMOLED module is used as a load, the efficiency during actual use can be tested, and the test is more accurate.

Of course, the display modules which adopt the DC/DC for power supply can also be adopted.

In specific implementation, optionally, based on the structure as shown in FIG. 2, related setting of the MOS transistor can be removed, that is, the load unit 7 only includes a control unit 71, a diverter switch 72 and an AMOLED module 79.

The control unit 71 is configured to, under the control of the main control unit 2, control the diverter switch 72 to conduct the ELVDD, ELVSS and AVDD input ends of the AMOLED module 79 with the first sub-output monitoring unit 61, the second sub-output monitoring unit 62 and the third sub-output monitoring unit 63, respectively.

The above content is merely to describe the specific structure of the load unit 7 through examples. In specific implementation, the specific structure of the load unit is not limited to the above structure according to the embodiment of the present disclosure, and can be other structures known to those skilled in the art, and the structure will not be defined herein.

Optionally, if the AMOLED module 79 is used as a load, as shown in FIG. 2, the test system according to the embodiment of the present disclosure further includes a signal generator 8. One end of the signal generator 8 is connected with the signal input end of the AMOLED module, while the other end of the signal generator 8 is connected with the main control unit 2. Under the control of the main control unit 2, the signal generator 8 provides different display signals for the AMOLED module.

In the embodiment of the present disclosure, the AMOLED module is provided with different signals through brightness adjustment.

The DC/DC being subjected to efficiency test is taken as an example below to illustrate the working principle of the test system as shown in FIG. 1 and FIG. 2.

In implementation, a test host 1 sends an instruction of beginning the DC/DC efficiency test to a main control unit 2. After the main control unit 2 receives the instruction, the main control unit 2 controls a programmable power supply 4 to output different voltages based on preset setting. The voltage output by the programmable power supply 4 is supplied to the DC/DC unit 3 after passing through the input monitoring unit 5, meanwhile, the input monitoring unit 5 may feed back to the main control unit 2 the monitored voltage and current supplied to the DC/DC unit 3. After the DC/DC unit converts the input voltage, three outputs of ELVDD, ELVSS and AVDD are supplied to the load unit 7. Under the control of the main control unit 2, the load unit 7 may have different DC/DC load currents, and the output monitoring unit 6 may monitor the output of the three outputs of the DC/DC unit 3 under different load currents, and feed back to the main control unit 2. The main control unit 2 feeds back the received monitored results to the test host 1, and the test host 1 analyzes and processes the received data to obtain the efficiency of the tested DC/DC unit 3 in different conditions.

Where the arrow in FIG. 2 can illustrate the direction of signals.

Figure 3:
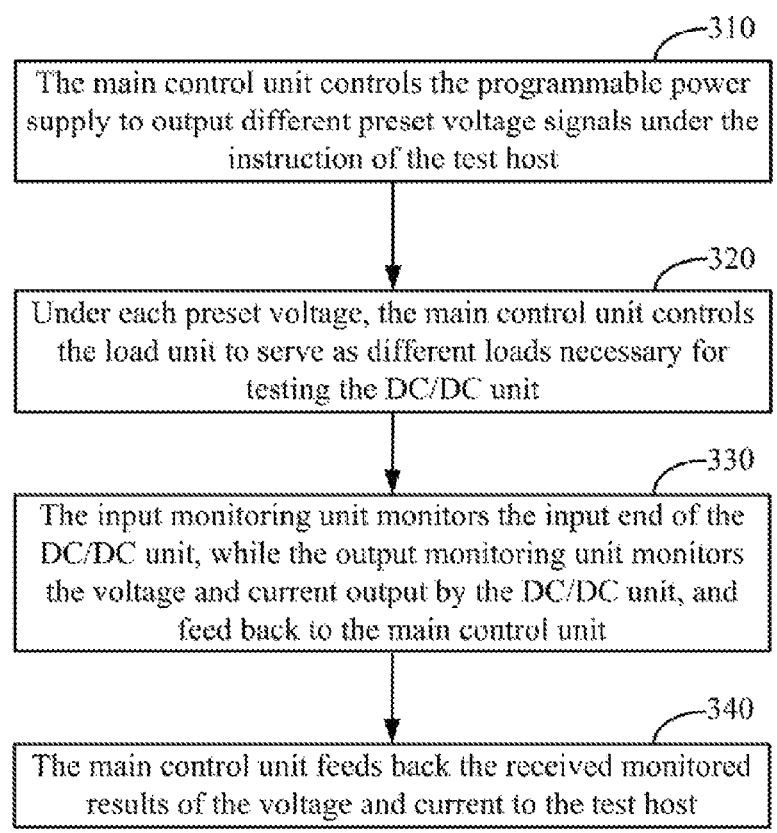
FIG. 3 is a flow diagram of a method for a DC/DC test system according to an embodiment of the present disclosure.

Based on the same disclosure concept, the embodiment of the present disclosure further provides a test method for the DC/DC test system according to any above embodiment, and as shown in FIG. 3, the test method at least includes the following steps.

Step 310, the main control unit controls the programmable power supply to output different preset voltage signals under the instruction of the test host.

Step 320, under each preset voltage, the main control unit controls the load unit to serve as different loads necessary for testing the DC/DC unit.

Step 330, the input monitoring unit monitors the input end of the DC/DC unit, the output monitoring unit monitors the voltage and current output by the DC/DC unit, and feed back to the main control unit.

Step 340, the main control unit feeds back the received monitoring results of the voltage and current to the test host.

In the embodiments of the present disclosure, based on the test system composed of the test host, the main control unit, the DC/DC unit, the programmable power supply, the input monitoring unit, the output monitoring unit and the load unit, the efficiency test of the DC/DC unit can be automatically realized, the test of linear adjustment rate and load regulation can be realized, and the test efficiency is improved.

Based on the test system according to the embodiment of the present disclosure, linear adjustment rate test can be conducted. Specifically, in the above step 310, controlling the programmable power supply to output different preset voltages can be specifically controlling different preset voltages to change according to a preset step size. The ELVDD, ELVSS and AVDD output voltages of the DC/DC unit under different input voltages are recorded to calculate the linear adjustment rate.

Based on the test system according to the embodiment of the present disclosure, load regulation rate test can be conducted. Specifically, in the above step 320, controlling the load unit to serve as different loads necessary for testing the DC/DC unit can be specifically controlling the current in the load unit to change according to a preset step size. Various output voltages of the DC/DC unit under different ELVDD, ELVSS and AVDD currents are recorded to calculate the load regulation rate.

Based on the test system according to the embodiment of the present disclosure, a Time Division Multiple Access (TDMA) test can also be conducted, the programmable power supply is set to be jumped constantly between two set voltages, an oscilloscope is added to monitor the output of each power supply of the DC/DC unit, and the fluctuation caused by the instaneous large-current to the output voltage of a battery when the radio frequency (RF) on a mobile phone is working can be simulated to test the anti-interference performance of the DC/DC.

Evidently, those skilled in the art can make various modifications and variations to the present disclosure without departing from the spirit and scope of the present disclosure. Accordingly, the present is also intended to encompass these modifications and variations thereto so long as the modifications and variations come into the scope of the claims appended to the present disclosure and their equivalents.

The invention claimed is:

1. A Direct Current to Direct Current (DC/DC) test system, comprising a test host, a main control unit, a DC/DC unit, a programmable power supply, an input monitoring unit, an output monitoring unit and a load unit, wherein:
   the main control unit is respectively connected with the test host, the programmable power supply, the load unit, the input monitoring unit and the output monitoring unit;
   the programmable power supply is further connected with the input monitoring unit;
   the load unit is further connected with the output monitoring unit;
   the DC/DC unit is respectively connected with the input monitoring unit and the output monitoring unit;
   the main control unit is configured to, under an instruction of the test host, control the programmable power supply to output different voltage signals, control the load unit to supply a load necessary for testing the DC/DC unit, receive an input voltage and current of the DC/DC unit monitored by the input monitoring unit and an output voltage and current of the DC/DC unit monitored by the output monitoring unit, and feed monitoring results back to the test host;
   wherein the output monitoring unit comprises a first sub-output monitoring unit, a second sub-output monitoring unit and a third sub-output monitoring unit;
      the first sub-output monitoring unit is respectively connected with an ELVDD output end of the DC/DC unit, an ELVDD input end of the load unit and the main control unit, and is configured to monitor the voltage and current of the ELVDD output end of the DC/DC unit;
      the second sub-output monitoring unit is respectively connected with an ELVSS output end of the DC/DC unit, an ELVSS input end of the load unit and the main control unit, and is configured to monitor the voltage and current of the ELVSS output end of the DC/DC unit; and
      the third sub-output monitoring unit is respectively connected with an AVDD output end of the DC/DC unit, an AVDD input end of the load unit and the main control unit, and is configured to monitor the voltage and current of the AVDD output end of the DC/DC unit;
   wherein the load unit comprises a control unit, a diverter switch and an AMOLED module;
      the control unit is configured to, under the control of the main control unit, control the diverter switch to conduct the ELVDD, ELVSS and AVDD input ends of the AMOLED module with the first sub-output monitoring unit, the second sub-output monitoring unit and the third sub-output monitoring unit respectively.

2. The system according to claim 1, wherein the programmable power supply comprises a first Digital to Analog Converter (DAC) and a first power amplifier;
   wherein the input end of the first DAC is connected with the main control unit, and the output end of the first DAC is connected with the input end of the first power amplifier;
   the output end of the first power amplifier is connected with the input end of the input monitoring unit.

3. The system according to claim 1, wherein the input monitoring unit comprises a first sampling resistor, a first operational amplifier, a second operational amplifier, a first Analog to Digital Converter (ADC) and a second ADC;

two ends of the first sampling resistor are respectively connected with the output end of the programmable power supply and the input end of the DC/DC unit; the first input end and the second input end of the first operational amplifier are respectively connected with the two ends of the first sampling resistor, while the output end of the first operational amplifier is connected with the input end of the first ADC; the output end of the first ADC is connected with the main control unit; the input end of the second operational amplifier is connected with the input end of the DC/DC unit, while the output end of the second operational amplifier is connected with the input end of the second ADC; and the output end of the second ADC is connected with the main control unit.

4. The system according to claim 1, wherein the first sub-output monitoring unit comprises a second sampling resistor, a third operational amplifier, a fourth operational amplifier, a third ADC and a fourth ADC; wherein:

two ends of the second sampling resistor are respectively connected with the ELVDD output end of the DC/DC unit and the ELVDD input end of the load unit; the first input end and the second input end of the third operational amplifier are respectively connected with the two ends of the second sampling resistor, while the output end of the third operational amplifier is connected with the input end of the third ADC; the output end of the third ADC is connected with the main control unit; the input end of the fourth operational amplifier is connected with the ELVDD output end of the DC/DC unit, while the output end of the fourth operational amplifier is connected with the input end of the fourth ADC; and the output end of the fourth ADC is connected with the main control unit.

5. The system according to claim 4, wherein the second sub-output monitoring unit comprises a third sampling resistor, a fifth operational amplifier, a sixth operational amplifier, a fifth ADC and a sixth ADC; wherein:

two ends of the third sampling resistor are respectively connected with the ELVSS output end of the DC/DC unit and the ELVSS input end of the load unit; the first input end and the second input end of the fifth operational amplifier are respectively connected with the two ends of the third sampling resistor, while the output end of the fifth operational amplifier is connected with the input end of the fifth ADC; the output end of the fifth ADC is connected with the main control unit; the input end of the sixth operational amplifier is connected with the ELVSS output end of the DC/DC unit, while the output end of the sixth operational amplifier is connected with the input end of the sixth ADC; and the output end of the sixth ADC is connected with the main control unit.

6. The system according to claim 5, wherein the third sub-output monitoring unit comprises a fourth sampling resistor, a seventh operational amplifier, an eighth operational amplifier, a seventh ADC and an eighth ADC; wherein:

two ends of the fourth sampling resistor are respectively connected with the AVDD output end of the DC/DC unit and the AVDD input end of the load unit; the first input end and the second input end of the seventh operational amplifier are respectively connected with the two ends of the fourth sampling resistor, while the output end of the seventh operational amplifier is connected with the input end of the seventh ADC; the output end of the seventh ADC is connected with the main control unit; the input end of the eighth operational amplifier is connected with the AVDD output end of the DC/DC unit, while the output end of the eighth operational amplifier is connected with the input end of the eighth ADC; and the output end of the eighth ADC is connected with the main control unit.

7. The system according to claim 6, wherein the load unit further comprises a first MOS transistor, a second MOS transistor, a second power amplifier, a third power amplifier, a second DAC and a third DAC; wherein:

the first end of the control unit is connected with the main control unit, and the second end of the control unit is connected with the diverter switch;

the gate of the first MOS transistor is connected with the output end of the second power amplifier; the first input end and the second input end of the second power amplifier are respectively connected with the output end of the third operational amplifier and the output end of the second DAC; and the input end of the second DAC is connected with the control unit;

the gate of the second MOS transistor is connected with the output end of the third power amplifier, and the source of the second MOS transistor is grounded; the first input end and the second input end of the third power amplifier are respectively connected with the output end of the seventh operational amplifier and the output end of the third DAC; and the input end of the third DAC is connected with the control unit;

the control unit is configured to, under the control of the main control unit, control the diverter switch to conduct the drain and source of the first MOS transistor respectively with the first sub-output monitoring unit and the second sub-output monitoring unit and conduct the drain of the second MOS transistor with the third sub-output monitoring unit, and control the second DAC and the third DAC to input different current signals.

8. The system according to claim 7, wherein the control unit is further configured to, under the control of the main control unit, control the diverter switch to switch between the following two states: in a first state, conduct the ELVDD, ELVSS and AVDD input ends of the AMOLED module with the first sub-output monitoring unit, the second sub-output monitoring unit and the third sub-output monitoring unit respectively; in a second state, conduct the drain and source of the first MOS transistor with the first sub-output monitoring unit and the second sub-output monitoring unit respectively, and conduct the drain of the second MOS transistor with the third sub-output monitoring unit.

9. The system according to claim 8, wherein the system further comprises a signal generator; one end of the signal generator is connected with the signal input end of the AMOLED module, while the other end of the signal generator is connected with the main control unit; the signal generator is configured to provide different display signals to the AMOLED module under the control of the main control unit.

10. The system according to claim 1, wherein the system further comprises a signal generator; one end of the signal generator is connected with the signal input end of the AMOLED module, while the other end of the signal generator is connected with the main control unit; the signal generator is configured to provide different display signals to the AMOLED module under the control of the main control unit.

11. A test method for a DC/DC test system according to claim 1, comprising:
- controlling, by the main control unit, under an instruction of the test host, the programmable power supply to output different preset voltage signals;
- controlling, by the main control unit, under each preset voltage, the load unit to serve as different loads necessary for testing the DC/DC unit;
- monitoring, by the input monitoring unit, the input end of the DC/DC unit, and feeding back to the main control unit;
- monitoring, by the output monitoring unit, the voltage and current output by the DC/DC unit, and feeding back to the main control unit; and
- feeding, by the main control unit, received monitoring results of the voltage and current back to the test host.

12. The method according to claim 11, wherein controlling the programmable power supply to output different preset voltage signals comprises: controlling different preset voltages to change according to a preset step size.

13. The method according to claim 11, wherein controlling the load unit to serve as different loads necessary for testing the DC/DC unit comprises: controlling the current in the load unit to change according to a preset step size.

* * * * *